United States Patent
Chuang

(10) Patent No.: US 7,207,834 B2
(45) Date of Patent: Apr. 24, 2007

(54) ELECTRICAL MOUNTING STRUCTURE

(75) Inventor: Chih-Peng Chuang, Taipei (TW)

(73) Assignee: Inventec Corporation (TW)

( * ) Notice: Subject to any disclaimer, the term of this patent is extended or adjusted under 35 U.S.C. 154(b) by 0 days.

(21) Appl. No.: 11/367,640

(22) Filed: Mar. 3, 2006

(65) Prior Publication Data

US 2007/0049110 A1    Mar. 1, 2007

(30) Foreign Application Priority Data

Aug. 25, 2005   (TW) .............................. 94214596 U

(51) Int. Cl.
*H01R 13/60*    (2006.01)
(52) U.S. Cl. ...................................... 439/534; 361/683
(58) Field of Classification Search ................. 439/534, 439/638, 207–216, 296–297; 385/135; 361/683
See application file for complete search history.

(56) References Cited

U.S. PATENT DOCUMENTS

| | | | | |
|---|---|---|---|---|
| 2,871,457 A | * | 1/1959 | Jencks et al. ............... | 439/370 |
| 4,940,414 A | * | 7/1990 | Lee ............................. | 439/131 |
| 5,200,874 A | * | 4/1993 | Ito ............................. | 361/627 |
| 5,441,421 A | * | 8/1995 | Ponticelli et al. ........... | 439/284 |
| 5,610,376 A | * | 3/1997 | Takagi et al. ............ | 200/50.01 |
| 6,157,534 A | * | 12/2000 | Gallagher et al. .......... | 361/683 |
| 6,790,079 B2 | * | 9/2004 | Berens et al. ............... | 439/534 |

* cited by examiner

*Primary Examiner*—Michael C. Zarroli
(74) *Attorney, Agent, or Firm*—Peter F. Corless; Steven M. Jensen; Edwards Angell Palmer & Dodge LLP

(57) ABSTRACT

An electrical mounting structure includes a first electronic device having a first connector; a second electronic device having a rear plate, the rear plate having at least one via hole and a second connector for being connected to the first connector of the first electronic device; and a connecting board disposed on the first electronic device and having at least one guiding portion and a fastening portion, the guiding portion for passing through the via hole to guide the first connector of the first electronic device to be aligned with and connected to the second connector of the rear plate, and the fastening portion for fastening the rear plate of the second electronic device to the first electronic device after the guiding portion has passed through the via hole and the first connector has been connected to the second connector.

10 Claims, 5 Drawing Sheets

ELECTRICAL MOUNTING STRUCTURE

FIELD OF THE INVENTION

The present invention relates to electrical mounting structures, and more particularly, to an electrical mounting structure having a connecting board for connecting two electronic devices.

BACKGROUND OF THE INVENTION

Computer-related electronic devices have been increasingly developed along with the progress of information technology and played an important role in human life. The electronic devices are required to provide various functions and have low fabrication costs in response to the competitive nature of the market.

Therefore, during fabrication of the electronic devices, not only maintenance of satisfactory product quality and manufacturing speed but also reduction in fabrication costs should all be considered. Particularly, each stage in the production line, such as the assembly speed of an optical disc drive to a casing of an electronic device, may affect the overall manufacturing progress.

A conventional optical disc drive is electrically connected via a connector thereof to a connector of an electronic device. As shown in FIGS. 1 and 2, a conventional electrical mounting structure 2 includes an optical disc drive 40, a rear plate 50 and a transfer board 60. Each of the optical disc drive 40 and the rear plate 50 is provided with a connector 401, 501 respectively. The transfer board 60 is mounted on the optical disc drive 40, and comprises a first connector 601 and a second connector 602, wherein the first connector 601 can be connected to the connector 401 of the optical disc drive 40 and the second connector 602 can be connected to the connector 501 of the rear plate 50. As a result, the optical disc drive 40 is electrically connected to the rear plate 50 by connecting the first and second connectors 601, 602 of the transfer board 60 to the connectors 401, 501 respectively.

However, the use of the first and second connectors of the transfer board to connect the connector of the optical disc drive to the connector of the rear plate undesirably increases the fabrication costs of the transfer board or the electrical mounting structure. Further, since the transfer board does not have a guiding function, when connecting/inserting the optical disc drive to the rear plate, it is not easy to quickly and correctly align and connect the optical disc drive with the rear plate, thereby causing inconvenience in the assembly process and affecting the assembly speed of the optical disc drive to the rear plate.

Therefore, the problem to be solved here is to provide an electrical mounting structure, which is cost-effective to implement and provides a guiding function.

SUMMARY OF THE INVENTION

In light of the above drawbacks in the prior art, a primary objective of the present invention is to provide a low-cost electrical mounting structure having a guiding function.

To achieve the foregoing and other objectives, the present invention proposes an electrical mounting structure comprising: a first electronic device having a first connector; a second electronic device having a rear plate, wherein the rear plate comprises at least one via hole and a second connector for being connected to the first connector of the first electronic device; and a connecting board disposed on the first electronic device and having at least one guiding portion and a fastening portion. The guiding portion of the connecting board may pass through the via hole of the rear plate of the second electronic device to guide the first connector of the first electronic device to be aligned with and connected to the second connector of the rear plate of the second electronic device. The fastening portion of the connecting board fastens the rear plate of the second electronic device to the first electronic device after the guiding portion has passed through the via hole and the first connector has been connected to the second connector.

The first connector of the first electronic device is disposed at a rear end of the first electronic device. Preferably, the first electronic device is an optical disc drive, and the first connector is a female connector.

Preferably, the second connector of the rear plate of the second electronic device is a male connector for connection with the female connector of the first electronic device, and the at least one via hole is formed on at least one side of the second connector of the rear plate.

The connecting board further includes a through hole formed at a position corresponding to the first connector of the first electronic device. The at least one guiding portion of the connecting board is formed on at least one side of the through hole and at a position corresponding to the at least one via hole of the rear plate.

The guiding portion of the connecting board is preferably a guiding post for guiding the first connector of the first electronic device to be aligned with and connected to the second connector of the rear plate of the second electronic device.

The fastening portion is extended perpendicularly from a surface of the connecting board, and is used to fasten a side edge of the rear plate when the first connector of the first electronic device is connected to the second connector of the rear plate of the second electronic device. Preferably, the fastening portion is a hook.

Therefore, by the electrical mounting structure of the present invention, the first connector of the first electronic device and the second connector of the rear plate of the second electronic device can be quickly and correctly connected to each other, and also the rear plate can be securely fastened to the first electronic device. Moreover, the electrical mounting structure of the present invention only uses the connecting board to achieve precise connection between the first electronic device and the rear plate of the second electronic device, thereby reducing the fabrication costs.

BRIEF DESCRIPTION OF DRAWINGS

The present invention can be more fully understood by reading the following detailed description of the preferred embodiments, with reference made to the accompanying drawings, wherein.

DETAILED DESCRIPTION OF PREFERRED EMBODIMENTS

Preferred embodiments of an electrical mounting structure proposed in the present invention are described as follows with reference to FIGS. 3 to 5.

In the following description, a server is used as an example to which an electrical mounting structure of the present invention is applied. However, it should be noted that besides the server, the electrical mounting structure is also applicable to a personal digital assistant (PDA), a desktop computer, a notebook computer and so on.

Figure 1:
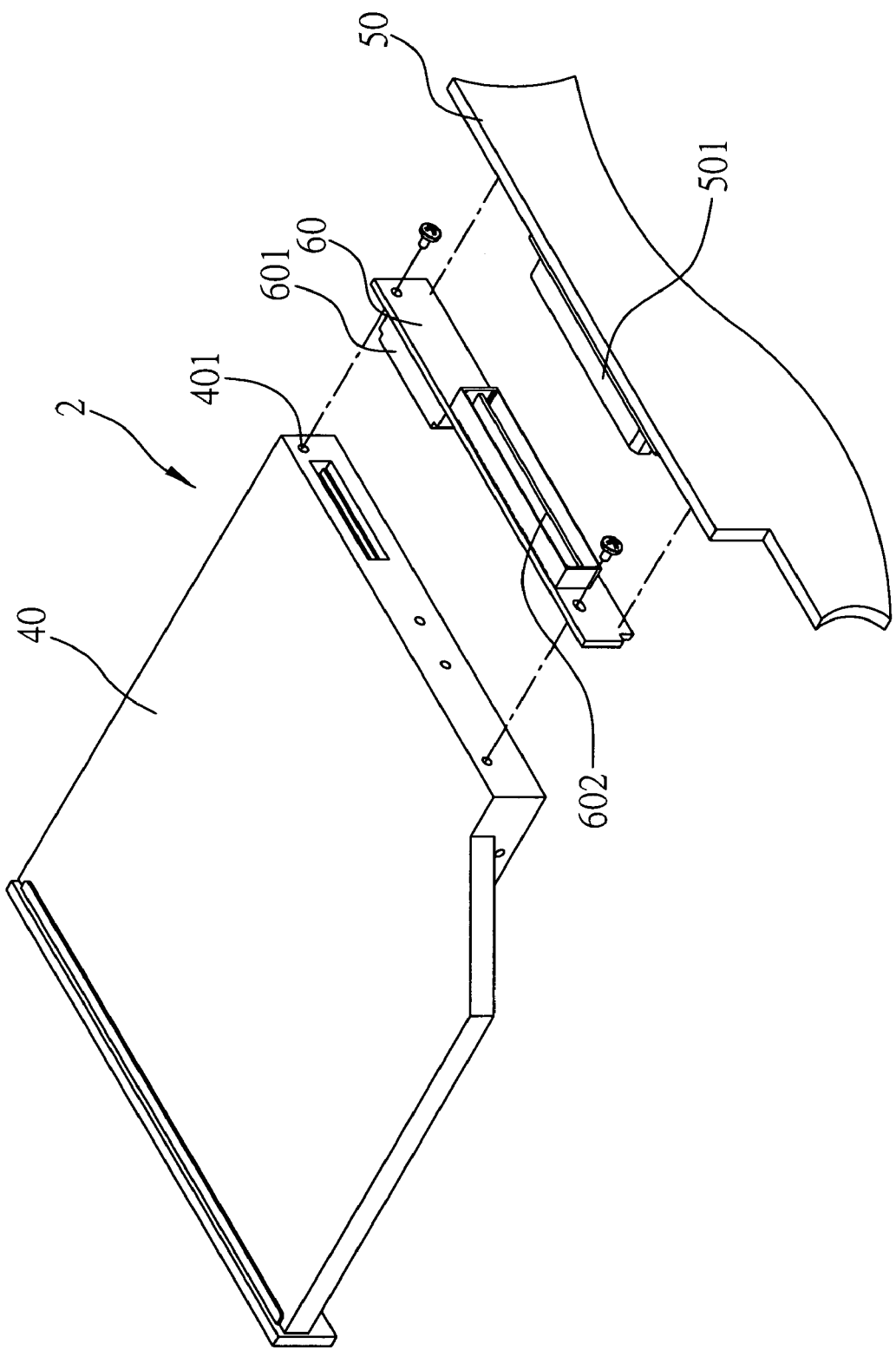
FIG. 1 (PRIOR ART) is a perspective exploded view of a conventional electrical mounting structure.
Figure 2:
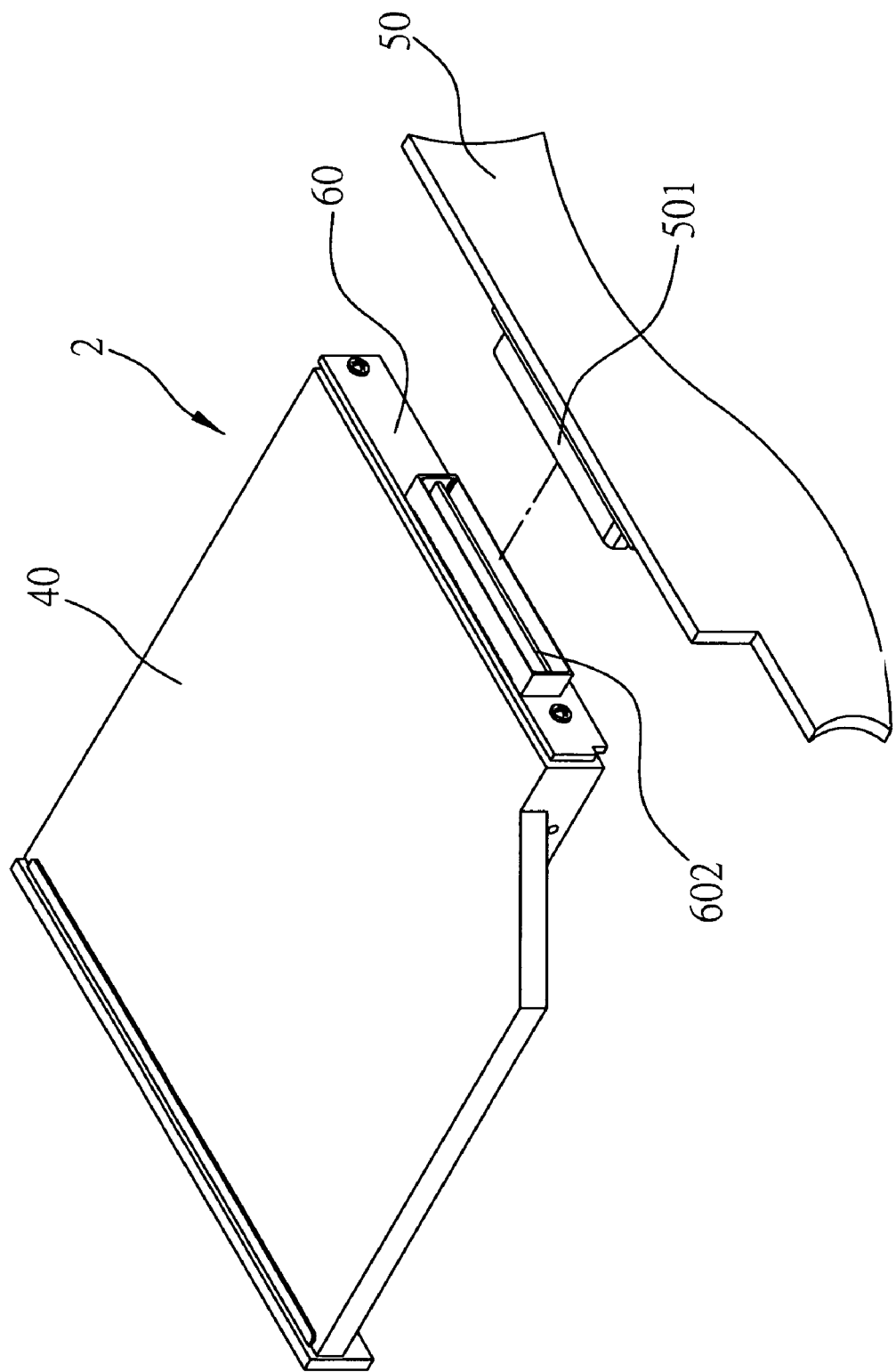
FIG. 2 (PRIOR ART) is a perspective view of an optical disk drive and a rear plate in the electrical mounting structure shown in FIG. 1.
Figure 3:
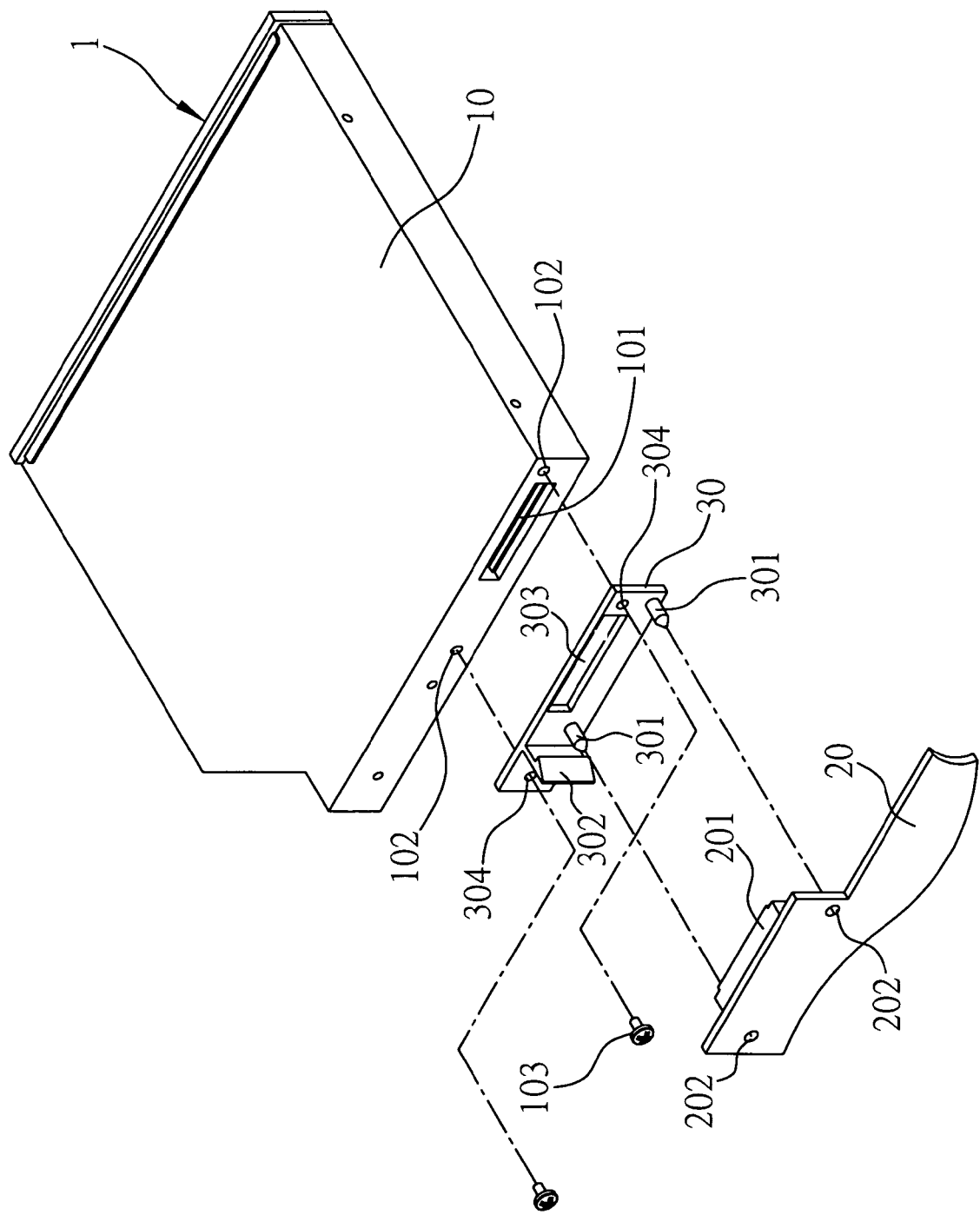
FIG. 3 is a perspective exploded view of an electrical mounting structure applied to a server according to the present invention.
Figure 4:
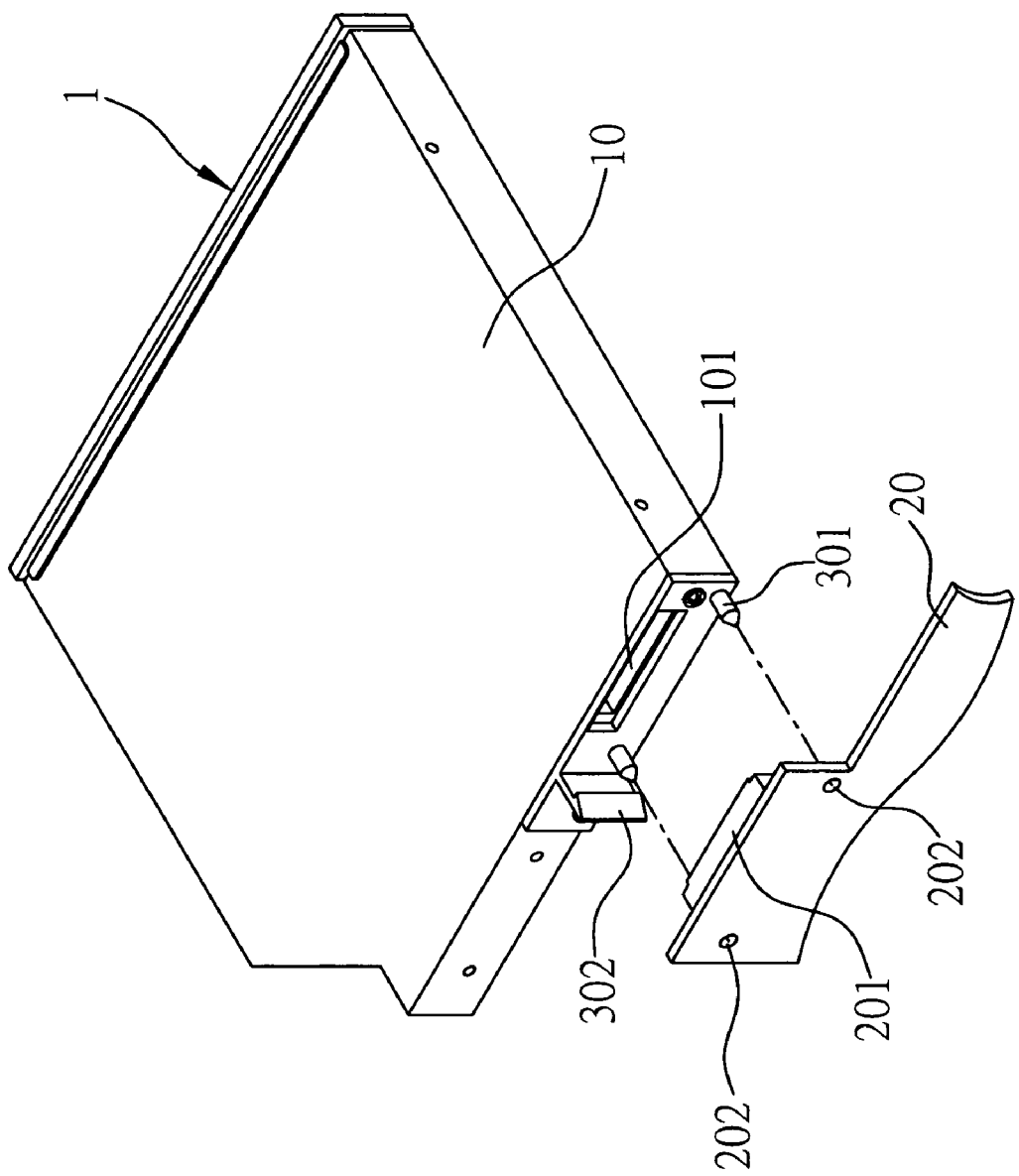
FIG. 4 is a perspective view of an optical disk drive and a rear plate in the electrical mounting structure shown in FIG. 3.

Referring to FIGS. 3 and 4, the electrical mounting structure 1 of the present invention comprises an optical disc drive 10 having a first connector 101; a rear plate 20 of the server, the rear plate 20 comprising via holes 202 and a second connector 201 for being connected to the first connector 101 of the optical disc drive 10; and a connecting board 30 disposed on the optical disc drive 10 and having guiding portions 301 and a fastening portion 302.

The first connector 101 is disposed at a rear end of the optical disc drive 10, and is a female connector in this embodiment. Screw holes 102 are respectively formed on two sides of the first connector 101.

The second connector 201 of the rear plate 20 is a male connector in this embodiment and can be connected to the female connector or first connector 101 of the optical disc drive 10. The via holes 202 of the rear plate 20 are respectively formed on two sides of the second connector 201.

The connecting board 30 further comprises a through hole 303 disposed at a position corresponding to the first connector 101 of the optical disc drive 10. The guiding portions 301 of the connecting board 30 are respectively formed on two sides of the through hole 303 and at positions corresponding to the via holes 202 of the rear plate 20.

The connecting board 30 is further formed with screw holes 304 at positions corresponding to the screw holes 102 of the optical disc drive 10. As such, when the connecting board 30 is connected to the optical disc drive 10, screw bolts 103 are used to pass through the corresponding screw holes 102, 304 to fasten the connecting board 30 to the optical disc drive 10 by means of the screw bolts 103.

Moreover, each of the guiding portions 301 of the connecting board 30 is a guiding post in this embodiment, for guiding the first connector 101 of the optical disc drive 10 to be aligned with and connected to the second connector 201 of the rear plate 20. The fastening portion 302 of the connecting board 30 is disposed between one of the screw holes 304 and one of the guiding portions 301, and is extended perpendicularly from a surface of the connecting board 30. The fastening portion 302 is used to fasten a side edge of the rear plate 20 when the first connector 101 of the optical disc drive 10 is connected to the second connector 201 of the rear plate 20. In this embodiment, the fastening portion 302 is a hook.

The connecting board 30 can be made of a plastic material, which is cost-effective to reduce the fabrication costs.

Figure 5:
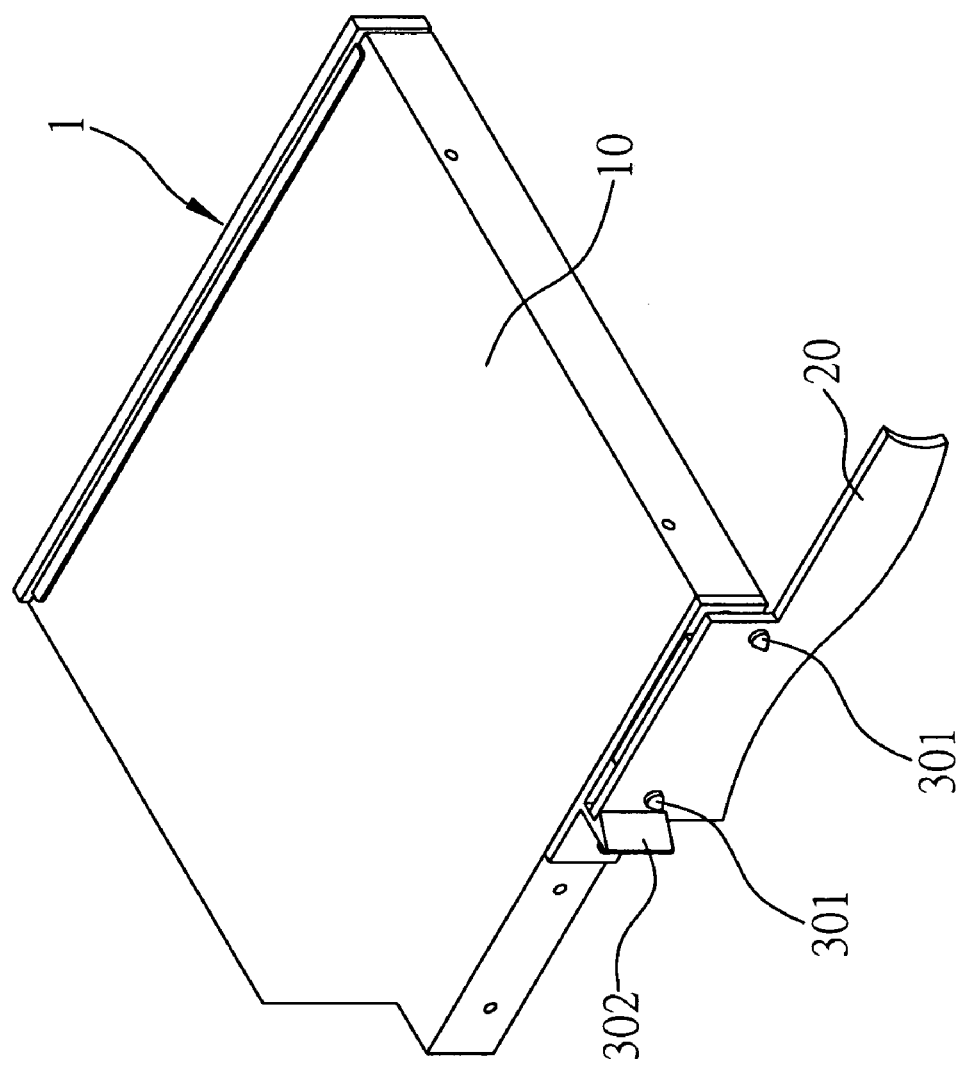
FIG. 5 is a perspective assembly view of the electrical mounting structure according to the present invention.

Referring to FIG. 5, to mount the optical disc drive 10 to the rear plate 20, first, the connecting board 30 is fastened to the optical disc drive 10 by using the screw bolts 103 to pass through the screw holes 304 of the connecting board 30 and the screw holes 102 of the optical disc drive 10 and allowing the screw bolts 103 to be engaged with the screw holes 102, 304. Then, the guiding portions 301 of the connecting board 30 assembled to the optical disc drive 10 are allowed to pass through the via holes 202 of the rear plate 20 so as to guide the first connector 101 of the optical disc drive 10 to be correctly and quickly aligned with the second connector 201 of the rear plate 20, such that the second connector 201 of the rear plate 20 can pass through the through hole 303 of the connecting board 30 to be connected to the first connector 101 of the optical disc drive 10. Moreover, the fastening portion 302 of the connecting board 30 can fasten the side edge of the rear plate 20 so as to enhance fastening of the rear plate 20 to the optical disc drive 10.

The connecting board of the present invention may further be provided with a pair of connecting portions to respectively fasten two sides of the rear plate to further enhance fastening of the rear plate to the optical disc drive. Since the provision of connecting portions can be anticipated and realized by a person skilled in the art, the detailed description and drawing thereof are omitted here.

Therefore, by the electrical mounting structure of the present invention, the first connector of the first electronic device and the second connector of the rear plate of the second electronic device can be quickly and correctly connected to each other, and also the rear plate can be securely fastened to the first electronic device. Moreover, the electrical mounting structure of the present invention only uses the connecting board to achieve precise connection between the first electronic device and the rear plate of the second electronic device, thereby reducing the fabrication costs.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An electrical mounting structure comprising:
   a first electronic device comprising a first connector;
   a second electronic device comprising a rear plate, the rear plate having at least one via hole and a second connector for being connected to the first connector of the first electronic device; and
   a connecting board disposed on the first electronic device, the connecting board comprising:
   at least one guiding portion for passing through the via hole of the rear plate of the second electronic device to guide the first connector of the first electronic device to be aligned with and connected to the second connector of the rear plate of the second electronic device;
   a fastening portion for fastening the rear plate of the second electronic device to the first electronic device when the guiding portion has passed through the via hole and the first connector has been connected to the second connector; and
   a through hole for allowing the second connector of the rear plate to pass through the through hole to be connected to the first connector of the first electronic device.

2. The electrical mounting structure of claim 1, wherein the first electronic device is an optical disc drive.

3. The electrical mounting structure of claim 1, wherein the first connector of the first electronic device is a female connector.

4. The electrical mounting structure of claim 1, wherein the second electronic device is one selected from the group consisting of a personal digital assistant (PDA), a desktop computer, a notebook computer and a server.

5. The electrical mounting structure of claim 1, wherein the second connector of the rear plate is a male connector.

6. The electrical mounting structure of claim 1, wherein the guiding portion of the connecting board is a guiding post.

7. The electrical mounting structure of claim 1, wherein the fastening portion is extended perpendicularly from a surface of the connecting board to fasten a side edge of the rear plate.

8. The electrical mounting structure of claim 7, wherein the fastening portion is a hook.

9. The electrical mounting structure of claim 1, wherein the fastening portion is a hook.

10. The electrical mounting structure of claim 1, wherein the connecting board is made of a plastic material.

* * * * *